(12) United States Patent
Liu et al.

(10) Patent No.: US 6,191,025 B1
(45) Date of Patent: Feb. 20, 2001

(54) METHOD OF FABRICATING A DAMASCENE STRUCTURE FOR COPPER MEDULLIZATION

(75) Inventors: Chung-Shi Liu; Chen-Hua Yu, both of Hsin-Chu (TW)

(73) Assignee: Taiwan Semiconductor Manufacturing Company, Hsin-chu (TW)

(*) Notice: Under 35 U.S.C. 154(b), the term of this patent shall be extended for 0 days.

(21) Appl. No.: 09/349,847

(22) Filed: Jul. 8, 1999

(51) Int. Cl.[7] .................................................. H01L 21/4763
(52) U.S. Cl. .................... 438/622; 438/627; 438/633; 438/637; 438/640; 438/672; 438/687
(58) Field of Search ..................................... 438/622, 623, 438/624, 627, 633, 637–640, 643, 687, 675, 672

(56) References Cited

U.S. PATENT DOCUMENTS

| 5,612,254 | 3/1997 | Mu et al. | 437/195 |
|---|---|---|---|
| 5,693,563 | 12/1997 | Teong | 437/190 |
| 5,741,626 | * 4/1998 | Jain et al. | 438/636 |
| 5,744,376 | 4/1998 | Chan et al. | 437/190 |
| 5,817,572 | 10/1998 | Chiang et al. | 438/624 |
| 5,821,168 | * 10/1998 | Jain | 438/692 |
| 5,880,018 | * 3/1999 | Boeck et al. | 438/619 |
| 6,054,398 | * 4/2000 | Pamanick | 438/784 |
| 6,100,181 | * 8/2000 | You et al. | 438/633 |
| 6,107,185 | * 8/2000 | Lukanc | 438/631 |

* cited by examiner

*Primary Examiner*—Charles Bowers
*Assistant Examiner*—Thanh Nguyen
(74) *Attorney, Agent, or Firm*—George O. Saile; Stephen B. Ackerman; Larry J. Prescott

(57) ABSTRACT

A method of fabricating a damascene structure for copper conductors. Layers of first, second, and third dielectric are formed on a silicon substrate having devices formed therein. The second dielectric will subsequently act as an etch stop. The third dielectric is a sacrificial layer used to protect the second dielectric. Contact holes are then etched in the layers of first, second, and third dielectric. A first barrier metal and a first conductor metal are then deposited filling the contact hole. The first barrier metal and first conductor metal are then removed down to a level between the original top surface of the layer of third dielectric and the top surface of the second dielectric using a method such as chemical mechanical polishing. The sacrificial third dielectric protects the layer of second dielectric during the chemical mechanical polishing. A layer of fourth dielectric is then deposited. Trenches are then etched in the fourth dielectric using the second dielectric, which has been maintained intact by the sacrificial third dielectric, as an etch stop. The trenches are then filled with a second barrier metal and second conductor metal. Excess second barrier metal and second conductor metal are then removed using chemical mechanical polishing to complete the damascene structure.

22 Claims, 5 Drawing Sheets

METHOD OF FABRICATING A DAMASCENE STRUCTURE FOR COPPER MEDULLIZATION

BACKGROUND OF THE INVENTION

1. Field of the Invention

This invention relates to a method of forming a copper damascene structure over a filled contact hole and more particularly to the use of a sacrificial dielectric layer to protect an etch stop layer during chemical mechanical polishing.

2. Description of the Related Art

As the cross section area of conductors in integrated circuits continue to shrink the conductivity of the conductor material becomes increasingly important. While aluminum has long been the conductor material of choice in integrated circuits, materials having greater conductivity such as gold, silver, copper, or the like are used with increasing frequency.

These metals have not had more widespread use because they suffer from a number of disadvantages such as the formation of undesirable intermetallics and high diffusion rates. Copper has the additional disadvantage of being easily oxidized at relatively low temperatures. One particular problem of this easy oxidation of copper is that conventional photoresist processing can not be used to pattern the copper. At the end of the patterning process using photoresist the photoresist must be removed by heating it in a highly oxidizing environment which also oxidizes the copper conductors. One solution to this problem is the Damascene process for forming conductors.

U.S. Pat. No. 5,744,376 to Chan et al. describes a method of forming copper interconnections using a damascene structure with provisions to prevent both copper diffusion and copper oxidation.

U.S. Pat. No. 5,693,563 to Teong describes a method of forming copper interconnections using an etch stop in a double damascene structure having provision to prevent both copper diffusion and oxidation.

U.S. Pat. No. 5,817,572 to Chiang et al. describes a method of forming copper damascene structures using etch stop layers and barrier layers to prevent copper diffusion and oxidation.

U.S. Pat. No. 5,612,254 to Mu et al. also describes a method of forming copper damascene structures using etch stop layers and barrier layers to prevent copper diffusion and oxidation.

Patent application Ser. No. 09/349,849 (TSMC-98-494), Filed Jul. 8, 1999, entitled "ROBUST POST Cu-CMP IMD PROCESS" and assigned to the same Assignee describes methods of cleaning exposed copper between the steps of chemical mechanical polishing and intermetal dielectric deposition.

Patent application Ser. No. 09/374,309 (TSMC-98-495), Filed Aug. 16, 1999, entitled "PASSIVATION METHOD FOR COPPER PROCESS" and assigned to the same Assignee describes methods of passivation of exposed copper in a copper damascene structure.

SUMMARY OF THE INVENTION

Forming damascene conductor structures using copper or other conducting materials requires the deposition of a layer of trench dielectric. A trench is then etched in the layer of trench dielectric to define the shape of the conductor. A layer of barrier metal is then deposited over the trench dielectric, on the sidewalls of the trench, and on the bottom of the trench. A conductor metal, such as copper, is then deposited on the layer of barrier metal to more than fill the trench. The barrier metal and conductor metal are then removed down to the level of the trench dielectric, usually using a method such as chemical mechanical polishing, to define the conductor.

Frequently the damascene structure is formed on top of a layer of interlevel dielectric or intermetal dielectric. The layer of interlevel dielectric or intermetal dielectric may have contact holes which are filled with conducting plugs. The damascene structure may form electrical contact with the conducting plugs filling the contact holes in the interlevel dielectric or intermetal dielectric. The layer of interlevel dielectric or intermetal dielectric usually has a layer of barrier dielectric formed thereon to act as an etch stop and protect the interlevel dielectric or intermetal dielectric during the formation of the damascene structure. The conducting plugs are formed by depositing one or more metals to more than fill the contact holes followed by chemical mechanical polishing to define the contact hole plugs. A key problem frequently encountered is damage to the layer of barrier dielectric during the chemical mechanical polishing step used to define the contact hole plugs. A sufficiently damaged layer of barrier dielectric will not perform satisfactorily as an etch stop.

It is a principle objective of this invention to provide a method of forming a damascene conductor structure over a layer of intermetal dielectric and a layer of barrier dielectric having contact plugs making electrical contact with the conductor of the damascene structure which does not damage the barrier dielectric.

It is another principle objective of this invention to provide a method of forming a damascene conductor structure over a layer of interlevel dielectric and a layer of barrier dielectric which does not damage the barrier dielectric.

These objectives are achieved by the use of a layer of sacrificial dielectric deposited on the layer of barrier dielectric. The chemical mechanical polishing step can remove a part of the layer of sacrificial dielectric without damaging the layer of barrier dielectric.

DESCRIPTION OF THE PREFERRED EMBODIMENTS

Figure 1:
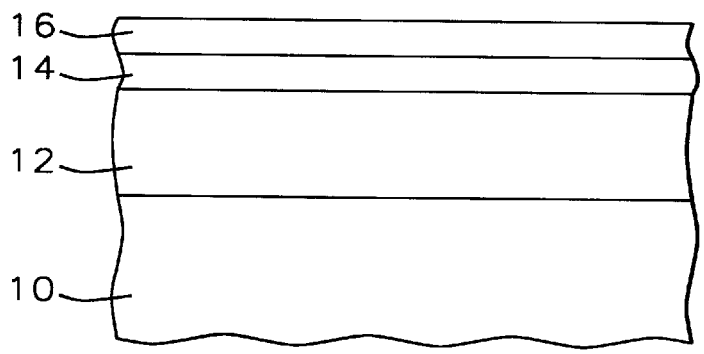
FIG. 1 shows cross section of a part of an integrated circuit substrate having a layer of intermetal or interlevel dielectric, a layer of barrier dielectric, and a layer of sacrificial dielectric formed thereon.

Refer now to FIGS. 1–8B for a more detailed description of the method of forming a damascene conductor structure of this invention. FIG. 1 shows a cross section view of a part of an integrated circuit substrate 10, such as a silicon wafer. The substrate 10 has devices formed therein, not shown, and may have contact regions of metal or silicide on the top surface of the substrate, not shown. A layer of first dielectric 12 is formed on the substrate. The layer of first dielectric 12 is preferably an oxide, such as silicon dioxide having a thickness of between about 6000 and 10,000 Angstroms, but may be any insulating material having a sufficiently low dielectric constant.

A layer of second dielectric 14 is then deposited on the layer of first dielectric 12. The layer of second dielectric must act as an etch stop in later processing steps and is preferably a layer of silicon oxynitride, SiON, having a thickness of between about 500 and 1000 Angstroms. Next a layer of third dielectric 16 is formed on the layer of second dielectric 14. The layer of third dielectric 16 forms a sacrificial dielectric layer and is the key to this invention. A part of the layer of third dielectric 16 will be removed in later processing steps. The layer of third dielectric is preferably an oxide layer, such as $SiO_2$ having a thickness of between about 500 and 1000 Angstroms, however other materials can be used. If SiON is used as the second dielectric and $SiO_2$ is used as the third dielectric the SiON and $SiO_2$ can be grown in the same chamber.

Figure 2:
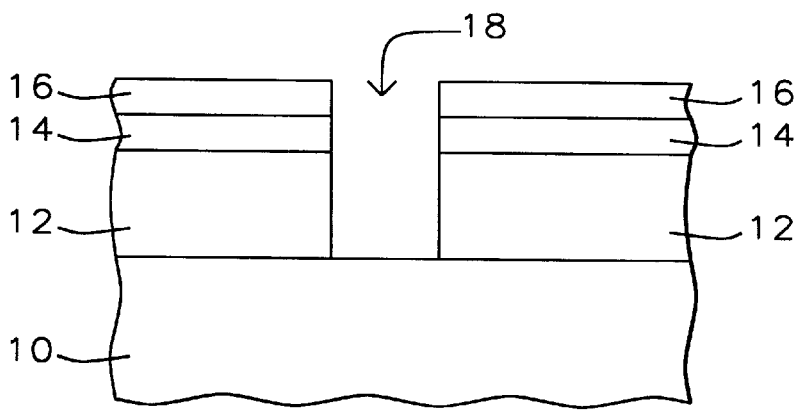
FIG. 2 shows a cross section of the integrated circuit substrate of FIG. 1 after etching a contact hole in the layers of intermetal or interlevel dielectric, barrier dielectric, and sacrificial dielectric.
Figure 3:
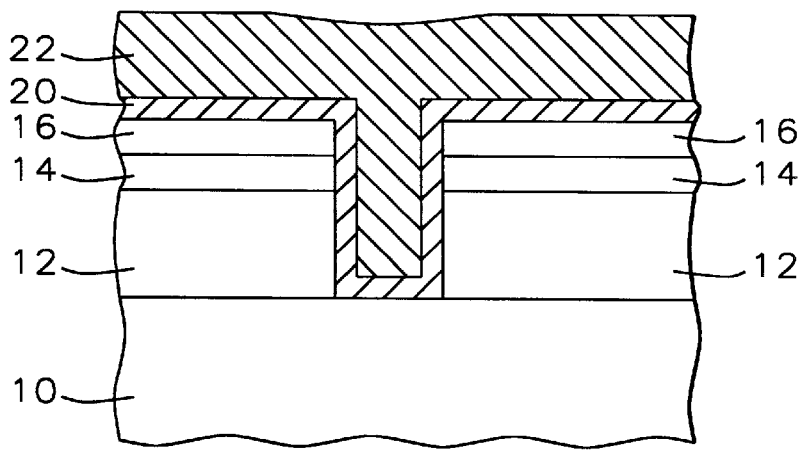
FIG. 3 shows a cross section of the integrated circuit substrate of FIG. 2 after a layer of first barrier metal and layer of first conductor metal have been deposited thereby filling the contact hole.

Next, as shown in FIG. 2, a contact hole 18 is etched in the layer of first dielectric 12, the layer of second dielectric 12, and the layer of third dielectric 16 using standard photolithographic methods. This contact hole will be located directly over contact regions of metal or silicide on the top surface of the substrate, not shown. As shown in FIG. 3, a layer of barrier metal 20, such as titanium or titanium nitride having a thickness of between about 100 and 500 Angstroms, is deposited on the layer of third dielectric 16 the sidewalls of the contact hole and the bottom of the contact hole. A layer of first conductor metal 22, such as tungsten, having a thickness great enough to more than fill the contact hole is deposited on the layer of first barrier metal 20.

Figure 4:
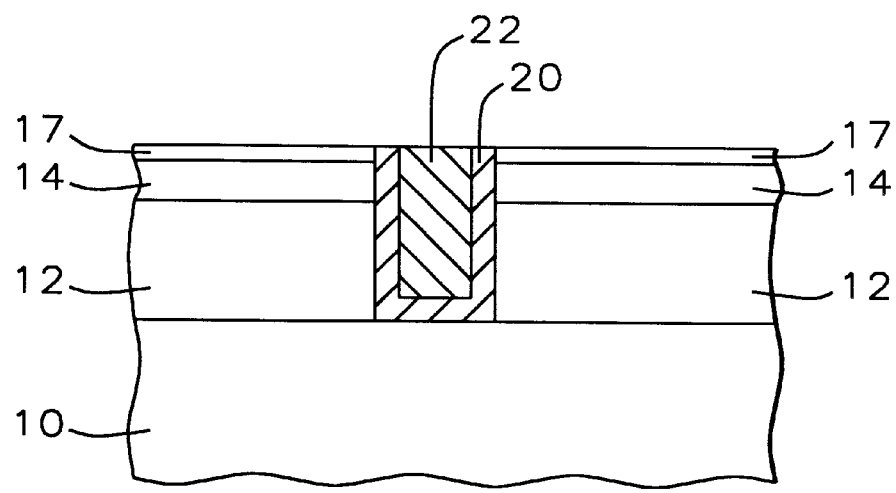
FIG. 4 shows a cross section of the integrated circuit substrate of FIG. 3 after removal of the layer of first barrier metal and layer of first conductor metal down to the top of the contact hole resulting in removal of part of the layer of sacrificial oxide.

Next, as shown in FIG. 4, is one of the key steps of the invention wherein the first barrier metal 20 and the first conductor metal 22 is removed down to a level between the original top surface of the layer of third dielectric 16 and the top surface of the layer of second dielectric 14 using a means such as chemical mechanical polishing. When this part of the first barrier metal and first conductor metal are removed, part but not all of the layer of third dielectric is also removed, leaving a residue 17 of the layer of third dielectric. This removal of part of the layer of third dielectric insures that residual metal is not left behind in the regions away from the contact hole and that the layer of second dielectric 14 is not damaged and can later function as an etch stop.

Figure 5:
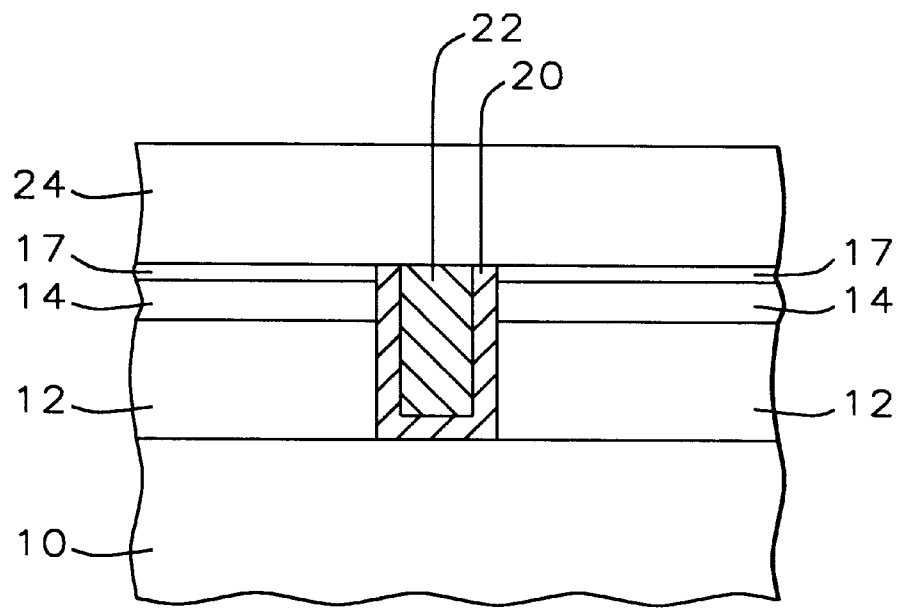
FIG. 5 shows a cross section of the integrated circuit substrate of FIG. 4 after a layer of trench oxide has been deposited.
Figure 6A:
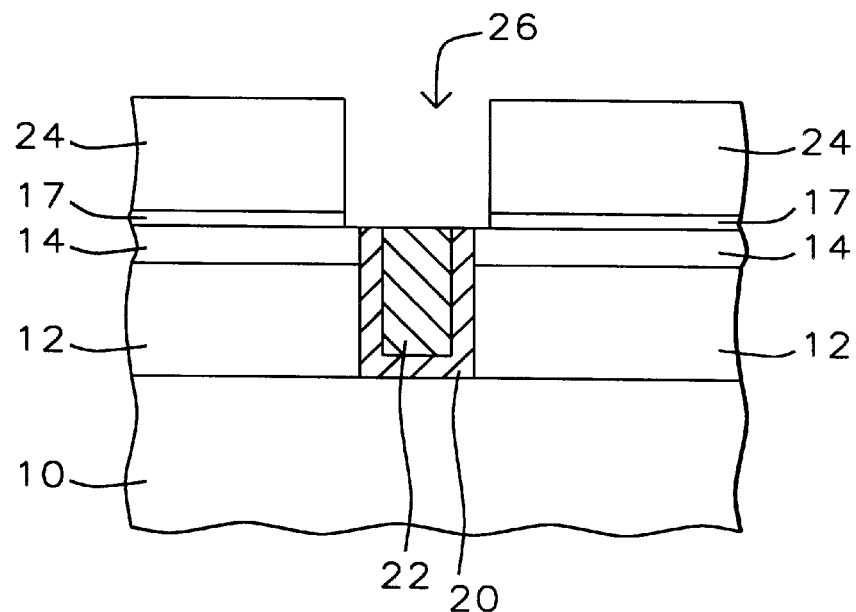
FIG. 6A shows a cross section of the integrated circuit substrate of FIG. 5 in the region of the filled contact hole after a trench has been formed in the layer of trench dielectric.
Figure 6B:
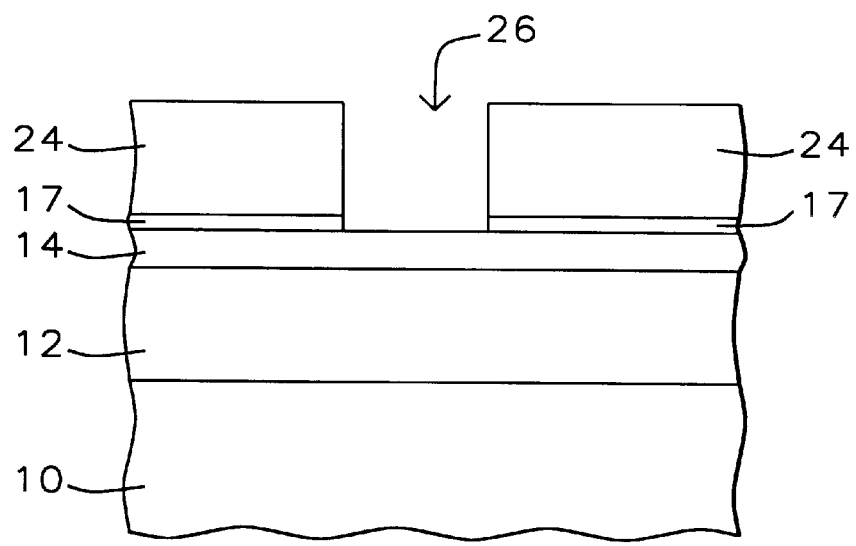
FIG. 6B shows a cross section of the integrated circuit substrate of FIG. 5 away from the region of the filled contact hole after a trench has been formed in the layer of trench dielectric.

Next, as shown in FIG. 5, a layer of fourth dielectric 24, is deposited on the residue 17 of the layer of third dielectric as well as the filled contact hole. The layer of fourth dielectric 24 is preferably an oxide, such as $SiO_2$ having a thickness of between about 3000 and 6000 Angstroms. As shown in FIGS. 6A and 6B, a trench 26 is then etched in the layer of fourth dielectric 24 in order to complete the damascene structure. The fourth dielectric is preferably etched using anisotropic etching with an etchant of $CHF_3/CF_4$. FIG. 6A shows the region of the substrate 10 where the trench 26 is directly over a filled contact hole. FIG. 6B shows the region of the substrate 10 away from a contact hole. The second dielectric 14 and the etching means used to etch the trench in the layer of fourth dielectric 24 are chosen so that in both cases, directly over a filled contact hole and away from a contact hole, the second dielectric layer 14 acts a an etch stop layer.

Figure 7A:
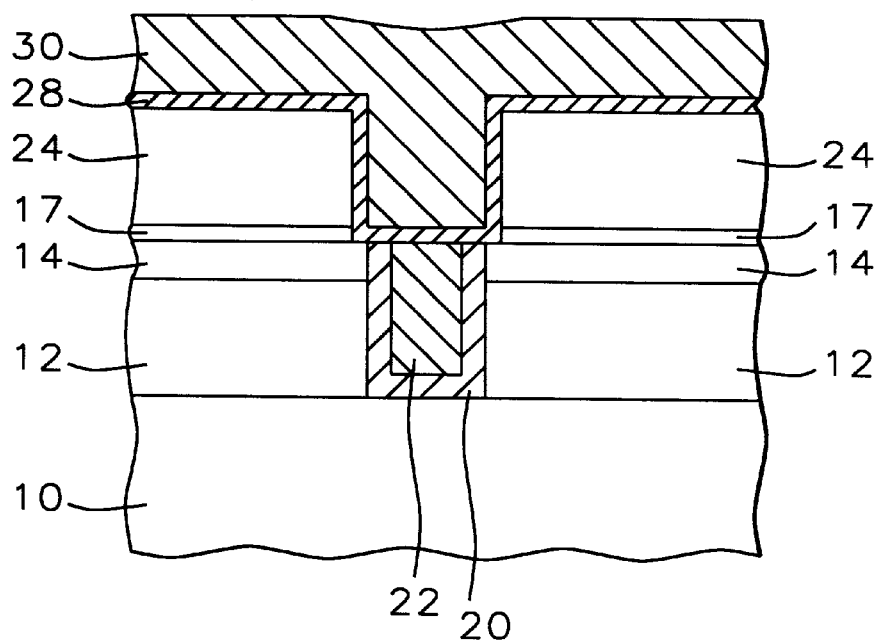
FIG. 7A shows a cross section of the integrated circuit substrate of FIG. 6A in the region of the filled contact hole after a layer of second barrier metal and layer of second conductor metal have been deposited thereby filling the trench.
Figure 7B:
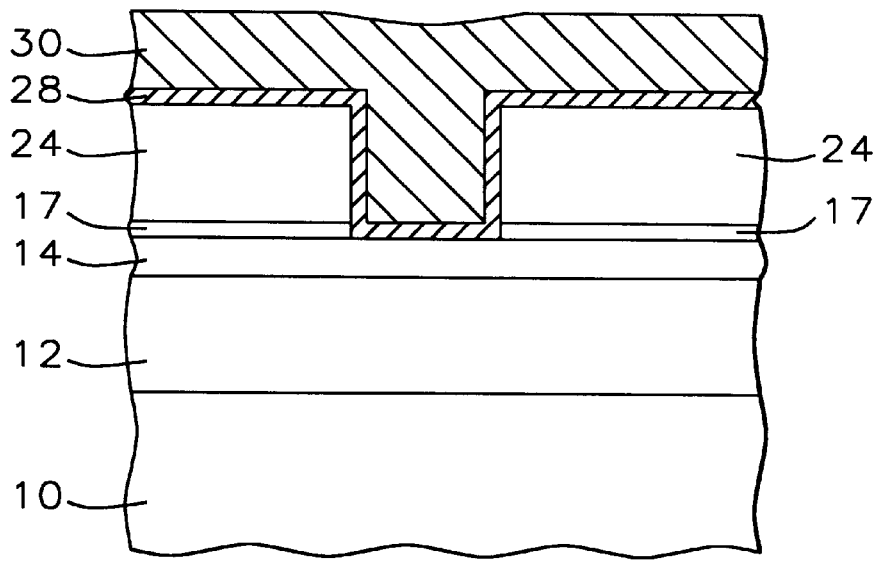
FIG. 7B shows a cross section of the integrated circuit substrate of FIG. 6B away from the region of the filled contact hole after a layer of second barrier metal and layer of second conductor metal have been deposited thereby filling the trench.

Next, as shown in FIGS. 7A and 7B, a layer of second barrier metal 28 is deposited on the layer of fourth dielectric 24, on the sidewalls of the trench, and on the bottom of the trench. As shown in FIG. 7A, at the location where the trench is directly over the filled contact hole the second barrier metal 28 makes electrical contact with the filled contact hole. Preferably the second barrier metal is titanium or titanium nitride having a thickness of between about 100 and 500 Angstroms. A layer of second conductor metal 30 is then deposited on the layer of second barrier metal 28 to a thickness large enough to more than fill the trenches. The second conductor metal 30 is a high conductivity metal, preferably copper.

Figure 8A:
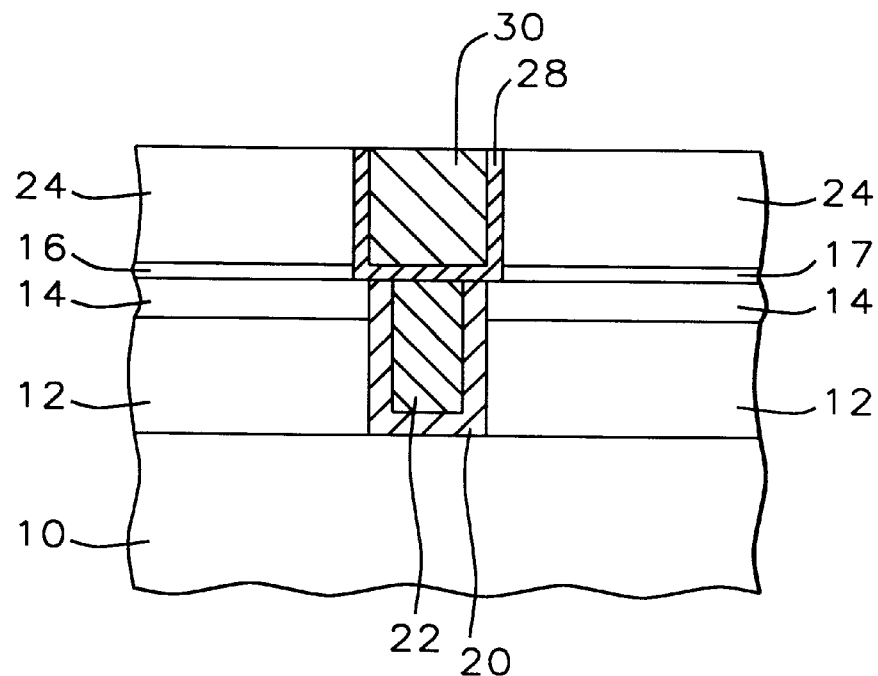
FIG. 8A shows a cross section of the integrated circuit substrate in the region of the filled contact hole showing the completed damascene structure for the case where the damascene conductor contacts the conductor metal in the contact hole.
Figure 8B:
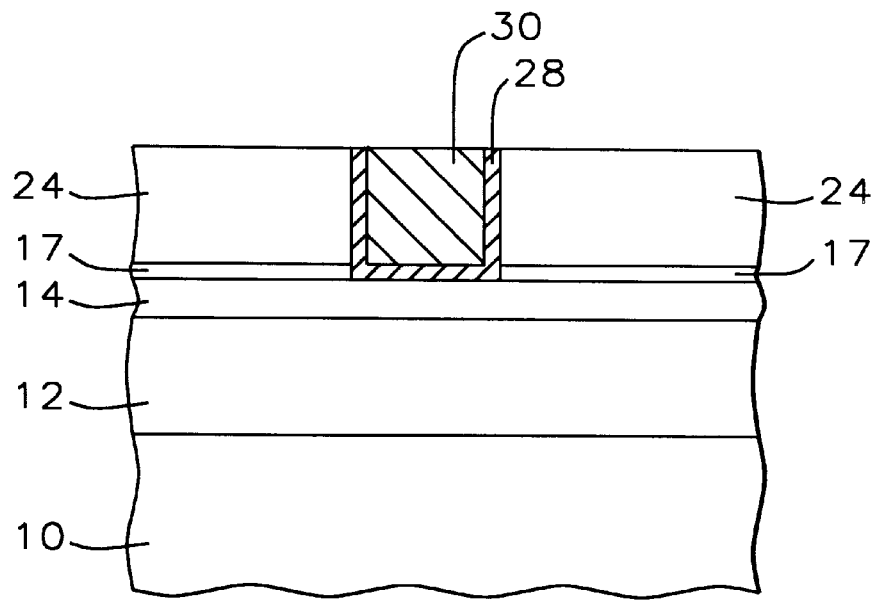
FIG. 8B shows a cross section of the integrated circuit substrate in the region away from the filled contact hole showing the completed damascene structure for the case where the damascene conductor is over dielectric only.

As shown in FIGS. 8A and 8B, the second barrier metal 28 and the second conductor metal 30 is then removed down to the level of the top surface of the fourth dielectric layer 24 using a method such as chemical mechanical polishing. FIG. 8A shows the region of the substrate 10 where the trench is directly over a filled contact hole. FIG. 6B shows the region of the substrate 10 away from a contact hole. FIGS. 8A and 8B show the completed damascene conductor and contact to the filled via hole. I desired, barrier materials, not shown, can then be deposited on the top of the damascene conductors to prevent diffusion or oxidation of the second barrier metal or second conductor metal.

Those skilled in the art will readily recognize that the layer of second dielectric can also act as an etch stop if via holes are etched in the layer of fourth dielectric.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a conductor in an integrated circuit, comprising:

providing a silicon substrate;

depositing a layer of first dielectric on said silicon substrate;

depositing a layer of second dielectric on said layer of first dielectric;

depositing a layer of third dielectric on said layer of second dielectric, wherein said layer of third dielectric is a sacrificial layer;

removing a part of said layer of third dielectric down to a level between the top of said layer of second dielectric and the top of said layer of third dielectric, using a first removal means, thereby planarizing said substrate;

depositing a layer of fourth dielectric on said layer of third dielectric after planarizing said substrate;

patterning and etching said layer of fourth dielectric, using an etching means chosen so that said layer of second dielectric acts as an etch stop, thereby forming a trench;

depositing a layer of barrier metal on said top surface of said layer of fourth dielectric, the bottom of said trench, and all sidewalls of said trench;

depositing a layer of conductor metal on said layer of barrier metal so as to more than fill said trench; and removing said conductor metal and said barrier metal down to the level of said fourth dielectric layer, using a second removal means, thereby forming a damascene conductor.

2. The method of claim 1 wherein said layer of first dielectric is a layer of silicon dioxide having a thickness of between about 6000 and 10,000 Angstroms.

3. The method of claim 1 wherein said layer of second dielectric is a layer of silicon oxynitride, SiON, having a thickness of between about 500 and 1000 Angstroms.

4. The method of claim 1 wherein said layer of third dielectric is silicon dioxide having a thickness of between about 500 and 1000 Angstroms.

5. The method of claim 1 wherein said layer of fourth dielectric is a layer of silicon dioxide having a thickness of between about 3000 and 6000 Angstroms.

6. The method of claim 1 wherein said first removal means is chemical mechanical polishing.

7. The method of claim 1 wherein said barrier metal is titanium, titanium nitride, or titanium and titanium nitride.

8. The method of claim 1 wherein said conductor metal is copper.

9. The method of claim 1 wherein said second removal means is chemical mechanical polishing.

10. The method of claim 1 wherein said layer of second dielectric is deposited in a chamber and said layer of third dielectric is deposited in the same chamber.

11. A method of fabricating a contact and a conductor in an integrated circuit, comprising:

providing a silicon substrate;

depositing a layer of first dielectric on said silicon substrate;

depositing a layer of second dielectric on said layer of first dielectric;

depositing a layer of third dielectric on said layer of second dielectric, wherein said layer of third dielectric is a sacrificial layer;

patterning and then etching said layer of first dielectric, said layer of second dielectric, and said layer of third dielectric, thereby forming a contact hole in said layer of first dielectric, said layer of second dielectric, and said layer of third dielectric;

depositing a layer of first barrier metal on said top surface of said layer of third dielectric, the bottom of said contact hole, and all sidewalls of said contact hole;

depositing a layer of first conductor metal on said layer of first barrier metal so as to more than fill said contact hole;

removing said first barrier metal, said first conductor metal, and a part of said layer of third dielectric down to a level between the top of said layer of second dielectric and the top of said layer of third dielectric using a first removal means, thereby forming a filled contact hole having a top surface;

depositing a layer of fourth dielectric on said layer of third dielectric and said top surface of said filled contact hole;

patterning and etching said layer of fourth dielectric, using an etching means chosen so that said layer of second dielectric acts as an etch stop, thereby forming a trench and exposing said top surface of said filled contact hole;

depositing a layer of second barrier metal on said top surface of said layer of fourth dielectric, the bottom of said trench, all sidewalls of said trench, and said exposed top surface of said filled contact hole so that said second barrier forms electrical contact with said filled contact hole;

depositing a layer of second conductor metal on said layer of second barrier metal so as to more than fill said trench; and removing said second conductor metal and said second barrier metal down to the level of said fourth dielectric layer, using a second removal means, thereby forming a damascene conductor.

12. The method of claim 11 wherein said layer of first dielectric is a layer of silicon dioxide having a thickness of between about 500 and 1000 Angstroms.

13. The method of claim 11 wherein said layer of second dielectric is a layer of silicon oxynitride, SiON, having a thickness of between about 500 and 1000 Angstroms.

14. The method of claim 11 wherein said layer of third dielectric is silicon dioxide having a thickness of between about 500 and 1000 Angstroms.

15. The method of claim 11 wherein said layer of second dielectric is deposited in a chamber and said layer of third dielectric is deposited in the same chamber.

16. The method of claim 11 wherein said layer of fourth dielectric is a layer of silicon dioxide having a thickness of between about 3000 and 6000 Angstroms.

17. The method of claim 11 wherein said first barrier metal is titanium, titanium nitride, or titanium and titanium nitride.

18. The method of claim 11 wherein said first conductor metal is tungsten.

19. The method of claim 11 wherein said first removal means is chemical mechanical polishing.

20. The method of claim 11 wherein said second barrier metal is titanium, titanium nitride, or titanium and titanium nitride.

21. The method of claim 11 wherein said second conductor metal is copper.

22. The method of claim 11 wherein said second removal means is chemical mechanical polishing.

* * * * *